United States Patent [19]

Kusakabe

[11] 4,292,584

[45] Sep. 29, 1981

[54] CONSTANT CURRENT SOURCE

[75] Inventor: Hiromi Kusakabe, Yokohama, Japan

[73] Assignee: Tokyo Shibaura Denki Kabushiki Kaisha, Kawasaki, Japan

[21] Appl. No.: 45,335

[22] Filed: Jun. 4, 1979

[30] Foreign Application Priority Data

Jun. 9, 1978 [JP] Japan ................... 53-69532

[51] Int. Cl.³ .............................................. G05F 3/20
[52] U.S. Cl. .................... 323/316; 307/297; 330/257
[58] Field of Search .................... 323/1, 4, 9, 16, 19, 323/22 T; 307/296 R, 297; 330/252, 257, 288, 307

[56] References Cited

U.S. PATENT DOCUMENTS

| | | | |
|---|---|---|---|
| 3,629,691 | 12/1971 | Wheatley, Jr. | 323/1 |
| 3,900,790 | 8/1975 | Ohsawa | 307/297 X |
| 3,914,683 | 10/1975 | Van de Plassche | 323/4 X |
| 3,962,592 | 6/1976 | Thommen et al. | 307/297 |
| 4,075,574 | 2/1978 | Gilbert | 330/257 |

FOREIGN PATENT DOCUMENTS

| | | |
|---|---|---|
| 1419748 | 12/1975 | United Kingdom . |
| 1468434 | 3/1977 | United Kingdom . |
| 1477224 | 6/1977 | United Kingdom . |

Primary Examiner—William M. Shoop
Assistant Examiner—Peter S. Wong
Attorney, Agent, or Firm—Cushman, Darby & Cushman

[57] ABSTRACT

A constant current source circuit having a first diode connected transistor for providing a first potential, a second diode connected transistor and a first resistor connected in series with the second diode connected transistor for providing a second potential, a comparator compares the first potential with the second potential to provide a first current corresponding to the potential difference between the first and second potentials, third and fourth transistors which respond to the first current to bias the first and second transistors, and a constant current output circuit which responds the first current to provide a constant current output.

16 Claims, 6 Drawing Figures

FIG. 1

PRIOR ART

CONSTANT CURRENT SOURCE

The invention relates to a constant current source.

In portable, battery-powered equipment, it is advantageous to use the smallest number of batteries possible. This allows the equipment size to be made small and the power source voltage to be made low, thus saving power consumption. Further, the electronic circuit used in such a low voltage battery-powered equipment must be operable at a low voltage. Also in this type equipment, the fatigue of the battery or a current change flowing through, for example, a power amplifier operating in the class B mode substantially influences the power source to change its voltage. However, it is required that the operating point of a circuit powered by the power source not changed as a result of the variation of the power source voltage. For the reason mentioned above, the electronic circuit used in the battery-powered equipment must normally be operable even at a voltage of approximately ½ of the power source voltage of a new battery.

Some of the constant current circuits, which have frequently been used in an integrated circuit (IC), are operable over a relatively small voltage range. Those conventional circuits, however, are defective in that the output current that can be drawn is limited and the circuit is susceptible to variation of the power source voltage.

Figure 1:
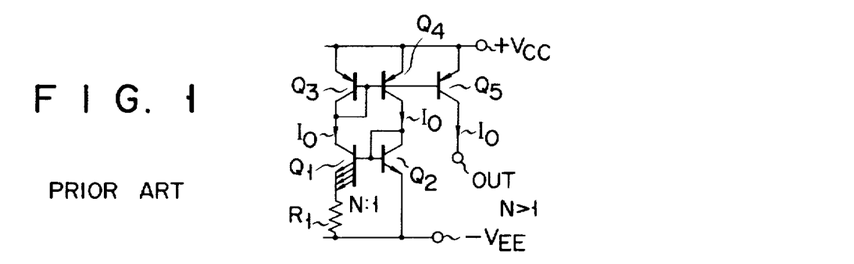
FIG. 1 shows a circuit diagram of prior art of the constant current source circuit relating to the field of the invention.

An example of the conventional constant current circuit is shown in FIG. 1. As shown, the constant current circuit is provided with a first current mirror circuit including transistors Q1 and Q2, the current gain of which depends largely on the collector currents thereof, and a second current mirror circuit including transistors Q3 and Q4, the current gain of which is always kept about 1 independently of the magnitudes of the collector currents. Another circuit of this type is disclosed in U.S. Pat. No. 3,629,691. The operation of the FIG. 1 circuit follows.

In a minute current range the voltage drop across a resistor R1, inserted in the emitter circuit of the transistor Q1 with a large emitter area, is negligible. For this, the current gain is proportional to the ratio of the emitter areas of the transistors Q1 and Q2. In this example, the emitter area ratio is N: and N>1. Accordingly, a positive feedback loop with a loop gain of about N is formed so that the current values of the transistors Q1 to Q4 are rapidly increased. When the current increases to reach a predetermined value Io, the current suppressive effect (current feedback by the resistor R1) starts to operate to settle the loop gain at 1, with the result that the circuit becomes stable with this state. In this situation, the following relation holds $$Io = V_T/R1 \times \ln N \quad (1)$$

where $V_T = kT/q$, T is absolute temperature, k is Boltzman's constant, and q is the electric charge of an electron. The value of the current Io is taken under an ideal condition that the current amplification factor of each transistor is infinite and the decrease of the current amplification factor β coming from the Early effect of a transistor and the like is not considered.

In fact, however, when the output current Io is derived from the transistor Q5, the sum of the base currents of the transistors Q3 to Q5 flows into the collector of the transistor Q1. Accordingly, the operating currents of the transistors Q1 and Q2 are unbalanced depending on the current amplification factors of the transistors Q3 to Q5. When pnp transistors such as Q3 to Q5 are integrated, those are generally fabricated to be of lateral structure with low current amplification factors β, for example, approximately 10 to 40 and with large variations of β. This tendency is more remarkable as the output current Io becomes larger. Accordingly, this restricts the maximum output current. The collector and emitter voltages $V_{CE}$ of those pairs of the transistors Q1 and Q2, and Q3 and Q4, which constitute the current mirrors, are different one another and the magnitudes of them depend on the power source voltage. Therefore, the magnitude of the output current Io is effected by the power source voltage when the Early effect is present, resulting in the appearance of the ripple component of the power source voltage in the output current Io.

Accordingly, an object of the invention is to provide a constant current source circuit which stably feeds a relatively large constant current and of which the output current is not substantially influenced by a variation of the power source voltage in the active operating region of the circuit.

To achive the object, there is provided a constant current source circuit comprising: first potential providing means including a first transistor connected in diode fashion and providing at one end a first potential; second potential providing means including a second transistor which is connected in diode fashion and has a lower emitter current density than the first transistor, and a first resistive element connected in series to the second transistor, the second potential providing means providing at one end a second potential; comparing means for comparing the first and second potentials to providing first current corresponding to a potential difference between these potentials; a third transistor for providing at the collector circuit a second current corresponding to the first potential providing means; a fourth transistor for providing at the collector circuit a third current corresponding to the first current to the second potential providing means; and current supply means for supplying a constant current output corresponding to the first current.

With such a circuit construction, the comparing means provides the first current to the current supply means providing a constant current output, the fourth transistor for biasing the second potential providing means, and the third transistor for biasing the first potential providing means. The comparing means may be formed by a symmetrical differential transistors circuit, for example, and therefore it is relatively free from the restriction on the first current increase in the circuit design. Accordingly, obtainable is the maximum first current with the magnitude corresponding to the common emitter current of the differential circuit. This means that the magnitude of the constant current output may be increased without any restriction and that variations of the current amplification factors of the third and fourth transistors bring about lesser variation of the operating point of the constant current circuit. (The circuit shown in FIG. 1 does not have such a comparing means). In case where the comparing means is constructed by using the symmetrical differential circuit, the Early effect of the transistor arising from the power source voltage variation little changes the first current. Further, the comparing means, the third and fourth transistors and the first and second potential providing means cooperate to form a negative feedback loop. As described above, the constant current output is little influenced by the variation of the power source voltage in the active operating region of the constant current circuit. Therefore, the power source ripple component is considerably reduced.

Other objects and features of the invention will be apparent from the following description taken in connection with the accompanying drawings, in which:

The invention will be described in detail with reference to the accompanying drawings. Throughout the drawings, like reference numerals will be used to designate like or equivalent portions, for simplicity of explanation.

Figure 2:
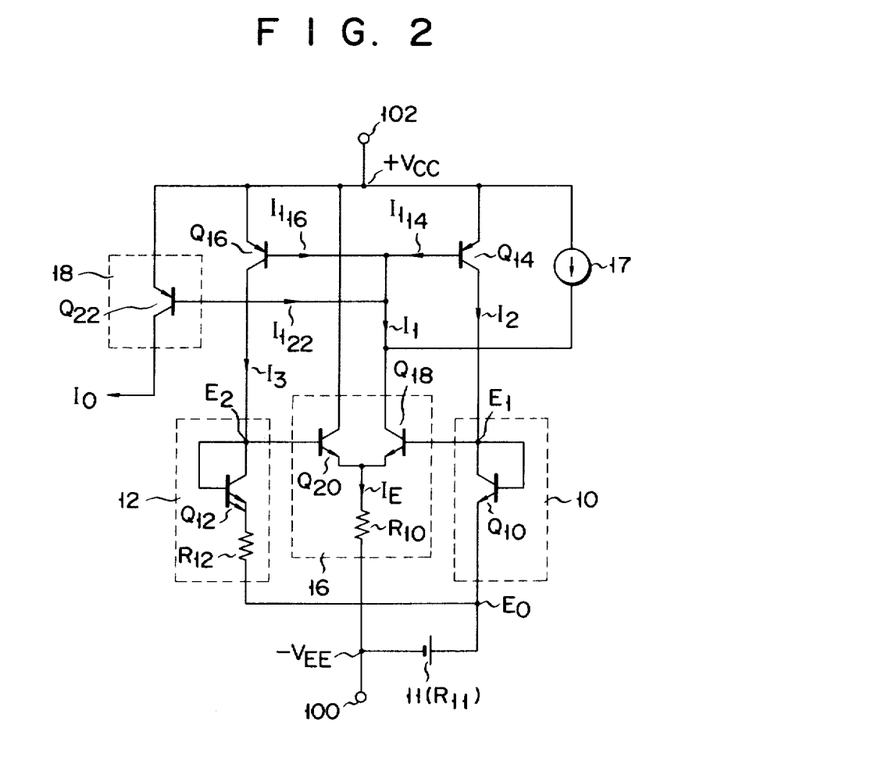
FIG. 2 shows a circuit of a basic construction of the constant current source circuit according to the invention.

Reference is made to FIG. 2 illustrating a basic circuit construction of a constant circuit according to the invention. The emitter of an npn transistor Q10 connected in diode fashion is connected to the terminal 100, through a level shift voltage source 11. The voltage source 11 is provided to compensate for a voltage drop across a resistor R10 to be described later. Generally, a voltage drop across a dide or a resistor is used for the voltage source 11. Connected to the terminal 100 is a first power source circuit (not shown) at a potential $-V_{EE}$. The multi-emitters of an npn transistor Q12 connected in diode fashion are connected to the emitter of the transistor Q10, through a resistor R12. The carrier concentration of the transistor Q10 or Q12 is generally selected to be uniform. The emitter area S12 of the transistor Q12 is selected larger than that S10 of the transistor Q10, i.e. $S12/S12 = N > 1$. In other words, if the operating current of the transistor Q10 is same as that of the transistor Q12, the emitter current densities of the transistors Q10 and Q12 are related to be N:1. That is to say, the emitter current density of the transistor Q10 is higher than that of the transistor Q12. The emitter area ratio N is not necessarily an interger and is usually selected to be approximately 4, i.e. $N \approx 4$. The transistor Q10 roughly forms a first potential providing means 10 and receives at the connection point between the base and the collector a first potential E1. The transistor Q12 and the resistor R12 cooperate to form a second potential providing means 12 and the transistor Q12 receives at the connection point between the base and the collector a second potential E2. Incidentally, the transistor Q12 and the resistor R12 are connected in series fashion. Therefore, the resistor R12 may be inserted in the base circuit of the transistor Q12.

The base and collector circuit of the transistor Q10 is connected to a terminal 102, through the collector to emitter path of a pnp transistor Q14. The terminal 102 is connected to a second power source circuit (not shown) of potential $+V_{CC}$. The base and collector path of the transistor Q12 is connected to the terminal 102, through the collector to emitter path of a pnp transistor Q16. The first and second potential providing means 10 and 12 are biased by the collector currents of the transistors Q14 and Q16.

The bases of the transistors Q14 and Q16 are connected to the collector of an npn transistor Q18. The base of the transistor Q18 is connected to the base and collector of the transistor Q10. The emitter of the transistor Q18 is connected to the emitter of an npn transistor Q20. The base of the transistor Q20 is connected to the base and collector circuit of the transistor Q12. The collector of the transistor Q20 is coupled with the terminal 102. The transistors Q18 and Q20 cooperate to form a comparing means 16 with a high output impedance. The comparing means or the differential circuit 16 compares the first potential E1 with the second potential E2. The differential circuit 16 provides a first current I1 corresponding to a potential difference between them. The first current I1 is taken out from the collector circuit of the transistor Q18. The emitters of the transistors Q18 and Q20 are connected to the terminal 100, through a resistor R10. The magnitude of the common emitter current $I_E$ of the differential circuit 16 may properly be set in accordance with the ratio Eo/R10 of the level shift potential by the power source voltage 11 to the resistor R10.

A current source 17 is connected between the terminal 102 and the collector of the transistor Q18. The provision of the current source 17 may balance the collector currents of the transistors Q18 and Q20, even when the common emitter current $I_E$ is selected to be large. A current mirror circuit of about 1 of the current gain is prefer to a simple constant current circuit for the purpose of forming the current source 17, because such a current mirror circuit may well balance the collector currents of the transistors Q18 and Q20.

The collector of the transistor Q18 is connected to the base of a pnp transistor Q22. The emitter of the transistor Q22 is connected to the terminal 102. The constant current Io is derived from the collector of the transistor Q22. The transistor Q22 roughly forms a current output circuit 18. The base current $I1_{22}$ of the transistor Q22, together with the base currents $I1_{14}$ and $I1_{16}$ of the transistors Q14 and Q16, flows into the collector circuit of the transistor Q18. In the circuit shown in FIG. 2, the first current I1 is expressed by $I1 = I1_{14} + I1_{16} + I1_{22}$. In other words, the transistors Q14, Q16 and Q22 are supplying the collector currents each corresponding to the first current I1. The second current I2 supplied from the collector of the transistor Q14 is applied to the base and the collector of the transistor Q10 in order to bias the first potential providing means 10. A third current I3 fed from the collector of the transistor Q16 is applied to the base and collector of the transistor Q12 to bias the second potential providing means 12. The first current I1 is derived from the collector of the transistor Q18 forming with the transistor Q20 a symmetrical differential circuit. The differential circuit of this type balances the potential difference between the voltages across the collector to emitter circuits of both the transistors. Therefore, the first current I1 is not substantially influenced by a variation of the power source voltage applied to the terminal 102 and 100, with the Early effect, so long as both the transistors Q18 and Q20 are in the active operating condition. This influence by the Early effect is further lessened when the current mirror circuit with the current gain of 1 is used for the current source 17.

If current source 17 is constructed like the current mirror circuit including the transistors Q3 and Q4 shown in FIG. 1, and that the current amplification factor of each of the transistors Q14 to Q22 is sufficiently large, the constant current output Io is expressed by the equation (1), as in the circuit of FIG. 1. In the circuit of FIG. 2, however, the potential differences applied across the first and second potential providing means 10 and 12 are approximately equal to each other and further the potential differences applied across the collector to emitter circuits of the transistors Q14 and Q16 are also approximately equal. Accordingly, in the active region of the transistors Q10 to Q22, the current amplification factor of each transistor little changes in unbalanced way due to the Early effect even if the potential difference Vcc+$V_{EE}$ between the terminals 102 and 100 changes. This means that a negligible amount of the ripple component arising from the variation of the potential difference Vcc+$V_{EE}$ appears in the constant current output.

The provision of the current source or the current mirror 17 may make the magnitude of the common emitter current $I_E$ much larger than the first current I1 while well balancing the current and voltage of the differential circuit 16. This permits a sufficiently large current $I1_{22}$ to flow into the transistor Q22 so that a relatively large constant current Io may be obtained without little unbalancing the differential circuit 16. The combination of the differential circuit 16 and the current source or the current mirror 17 additionally brings about the following beneficial effects. Even if the variation of the current amplification factor of each transistor Q14, Q16 and Q22 causes the first current I1 to change, the sufficiently large common emitter current $I_E$ almost excludes the variation of the operating point of the differential circuit 16 due to the variation of the current I1.

Moreover, the circuit in FIG. 2 is operable at a low voltage. Assume now that all the transistors in the FIG. 2 circuit are of silicon type and the shift voltage by the voltage source 11 is 0.2 V. The bipolar transistor of silicon type is active when the collector to emitter voltage $V_{CE}$ is approximately 0.3 V or more. If the threshold voltage $V_{BE}$ across the base to emitter circuit is 0.6 V, and the potential at the terminal 100 is 0, the emitter potential Eo of the transistor Q10 is 0.2 V and the base potential of the transistor Q18 is 0.8 V. If the $V_{CE}$ of the transistor Q18 is 0.6 V, the emitter potential and the collector potential of the transistor Q18 are 0.2 V and 0.8 V, respectively. Since the $V_{BE}$ of the transistor Q14 is 0.6 V, the potential at the emitter of the transistor Q14 or at the terminal 102 is 1.4 V. At this time, the $V_{CE}$ of the transistor Q14 is 0.6 V. Those potential values are given on the assumption that the $V_{CE}$ of each transistor Q14 to Q22 is 0.6 V. In fact, those transistors are operable when $V_{CE}$ is about 0.3 V and further about 0.1 V is allowable for the voltage power source 11. Accordingly, the lower limit of the voltage between the terminals 100 and 102 is approximately 1 V.

As described above, the circuit diagram shown in FIG. 2 may provide a constant current circuit which is operable at a low voltage, provide stably a relatively large constant current output Io, and is resistive to the variation of the power source voltage ($V_{CC}+V_{EE}$).

Figure 3:
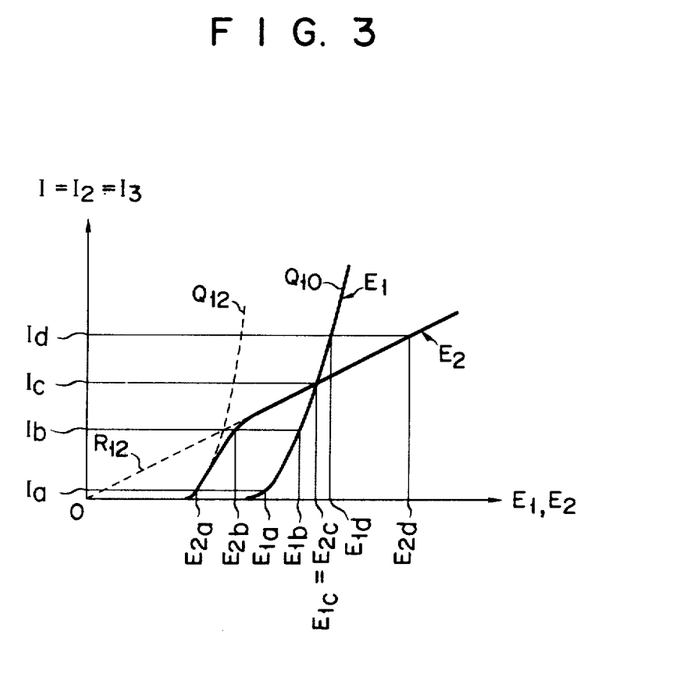
FIG. 3 shows a graph for illustrating the operation of the circuit in FIG. 2 in which the Y-axis represents currents I2 and I3 and the X-axis potentials E1 and E2.

The operation of the circuit shown in FIG. 2 follows. Let us first consider a case where the first current I1 is minute and therefore the second and third currents I2 and I3 are also very small. In this case, it is assumed that the voltage drop across the resistor R12 is so small to be negligible, and that the current amplification factors of the transistors Q14 and Q16 are equal to each other and I2=I3. This state is illustrated by I=Ia in FIG. 3. In FIG. 3, a curve E1 shows a voltage vs. current characteristic and a curve E2 shows a composite characteristic curve of a base-to-emitter voltage vs. current characteristic of the transistor Q12 and a voltage vs. current characteristic by the resistor R12. In the figure, the respective curves are depicted exaggeratedly for the purpose of easy understanding. Since the ratio of the emitter current densities of the transistors Q10 and Q12 are N:1, the voltage drop across the transistor Q10 is larger than that across the transistor Q12. A difference between those voltage drops, i.e. a potential difference E1−E2, is $$E1-E2 = V_T \ln N \quad (2)$$

where $V_T = kT/q$. The equation (2) is discussed in detail in U.S. Pat. No. 3,629,691, paragraphs 3 to 4. Accordingly, the derivation of the equation (2) is omitted here. What you merely bear in mind here is that the equation (2) holds and that E1−E2 in the equation (2) is approximately 36 mV at room temperature ($\approx$300 K) and when N=4. That is to say, when I=Ia, the base potential of the transistor Q18 or the first potential E1a is several ten mV higher than the base potential of the transistor Q20, with the result that the collector current of the transistor Q18 is increased. Upon this, the first current I1 increases and the base currents of the transistors Q14, Q16 and Q22 increase. Further, the second and third currents I2 and I3 increases and the voltage drop (R12×I3) across the resistor R12 also increases. When the potential difference E1−E2 and the voltage drop R12×I3 are equal, that is to say, when the following equation holds $$V_T \ln N = R12 \times I3 \ (= R12 \times Ic) \quad (3)$$

the potential difference E1−E2 becomes zero (0), i.e. E1c=E2c, and the circuit operation in FIG. 2 settles down. I=Ic in FIG. 3 indicates this state.

Let us next consider a case where some reason causes the second current I2 and the third current I3 to increase.

Such a current increase takes place, for example, when the constant current Io decreases and the base current $I1_{22}$ decreases, or when the ambient temperature rises. The former case corresponds to a situation that, with respect to the fixed first current I1, the current sum $I1_{14}+I1_{16}$ increases corresponding to an amount of decrease of $I1_{22}$. The latter case corresponds to a situation that the rise of temperature causes the current amplification factor β of each of the transistors Q14, Q22 and Q16. As indicated by I=Id in FIG. 3, when the currents I2 and I3 are increased, the first potential E1d is lower than the second potential E2d. Upon this, the collector current of the transistor Q18 descreases and the first current I1 also decreases. As a result, the base currents of the transistors Q14 and Q16 decrease to also decrease the currents I2 and I3. When the current I (=I2=I3) decreases up to Ic, the input potential difference E1c−E2c in the differential circuit 16 becomes zero and stable.

Conversely, when the currents I2 and I3 decrease as indicated by I=Ib in FIG. 3, the inverse operation to the above-mentioned operation is performed. More specifically, E1b>E2b, the first current I1 increases and the current I approaches to the current Ic. As described above, the circuit including the transistors Q10 to Q20 forms a servo loop or a negative feedback loop of which the target value is Ic or E1=E2. The target value Ic in the feedback operation may be determined only by the first and second potential E1 and E2. Therefore, the open loop gain of the feedback loop is sufficiently high, even if the base currents of the transistors Q14, Q16 and Q22 change, the amount of the current change is absorbed through the feedback operation. Accordingly, the variation of the constant current output Io due to the variation of the current amplification factor of each transistor Q14 to Q22 is minimized. For this reason, when the constant current source circuit is mass-produced in the form of integrated circuits, a variation of the constant current outputs Io may be within a tolerable range of the target value of design. Further, it is possible to get almost zero temperature coefficients of the first potential E1 and second potential E2. If the potential at the terminal 100 is zero and the voltage source 11 is replaced by the resistor R11, the emitter potential Eo of the transistor Q10 is $$Eo = R11(I2+I3) \tag{4}$$

When the equation (3) is rewritten by using the relation $V_T = kT/q$, we have $$I3 = (1/R12) \times (kT/q) \ln N \tag{5}$$

By substituting the equation (5) into the equation (4) with I2=I3, we have $$Eo = 2R11 \times I3 = 2(R11/R12)(kT/q) \ln N \tag{6}$$

When the base to emitter voltage of the transistor Q10 is $V_{BE}$, the first potential E1 may be expressed by $$E1 = Eo + V_{BE} = 2(R11/R12)(kT/q) \ln N + V_{BE} \tag{7}$$

By partially differentiating both the sides by temperature T, we have $$\partial E1/\partial T = 2(R11/R12)(k/q) \ln N + (\partial/\partial T)V_{BE} \tag{8}$$

The first term in the right side in the equation (8) is positive and the second term is negative. Accordingly, when R11/R12 and/or N is properly selected, the temperature coefficient of the first potential E1 may be zeroed.

As described above, the FIG. 2 circuit is stabilized through the negative feedback operation at the time that E1−E2 becomes zero, i.e. when E1=E2. Accordingly, when $\partial E1/\partial T=0$, $\partial E2/\partial T$ also becomes zero at the stable point. The potential Eo at this time is ordinarily 0.5 V.

The resistor R10 and/or the resistor R11 (the voltage source 11) may be substituted by an impedance circuit such as constant current circuit.

Let us study the open loop gain of the FIG. 2 circuit when the current source 17 is a current mirror circuit with the current gain of 1. The natual conductance Gm in the path from the base side differential input of the transistors Q18 and Q20 to the output current I2 or I3 of the transistor Q14 or Q16 is given by $$Gm = (I_E/2V_T)\beta pnp \tag{9}$$

where $I_E$ is the common emitter current of the differential transistors Q18 and Q20 and is expressed by $I_E = I2+I3 = 2I2 = 2I3$, and $\beta pnp$ is the current amplification factor of the transistor Q14 or Q16.

The voltage drop $\Delta V2$ across the Q12 and the resistor R12 circuit and the voltage drop $\Delta V1$ across the transistor Q10 and given by the following equations $$\Delta V1 = V_T \ln (I/Is) \tag{10}$$

$$\Delta V2 = V_T \ln (I/NIs) + R12 \times I \tag{11}$$

where $I = I2 = I3$ and Is is the inverse saturation current of each of the transistors Q10 and Q12.

The differential voltage $V_{IN}$ of the transistors Q18 and Q20 is $$V_{IN} = \Delta V2 - \Delta V1 = R12 \times I - V_T \ln N$$

Further, an equivalent load resistor $R_L$ for the transistors Q14 and Q16 is expressed by the following equation $$R_L = \partial V_{IN}/\partial I = R12 \tag{12}$$

Therefore, the open loop gain $G_L$ is $$G_L = GmR_L = I_E/2V_T \times \beta pnp \times R12 \tag{13}$$

In a typical example where $V_T$ is 26 mV, $\beta pnp=20$, R12=360 Ω, and $I_E=400$ μA, $G_L$ is 55 (35 dB) and this value is proper. Incidentally, when the $G_L$ is excessively high, oscillation is likely to takes place. Accordingly, excessively high $G_L$ should be avoided.

The conductivity type of the transistors used in the above-mentioned embodiment may be interchanged between pnp and npn. In this case, the polarity of the power source voltage and the current direction are inverted.

Figure 4:
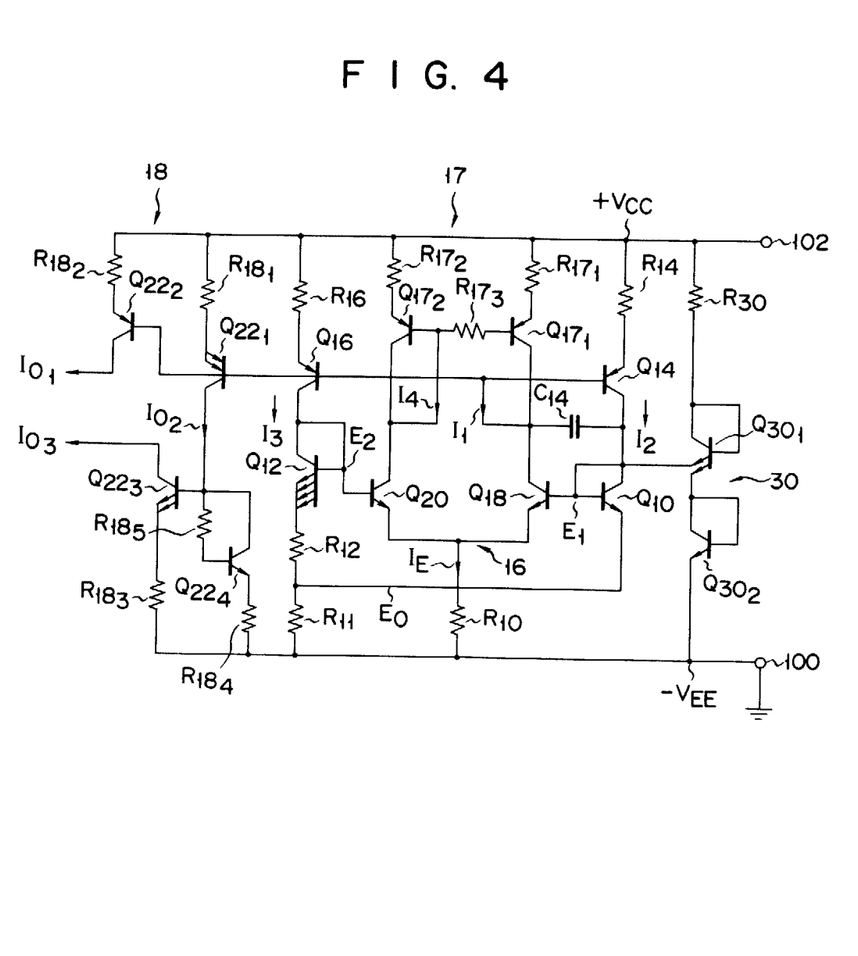
FIG. 4 shows a circuit diagram of the constant current source circuit which is constructed on the basis of the circuit in FIG. 2.

FIG. 4 shows a circuit diagram of a constant current source constructed on the basis of the circuit in FIG. 2 which is one of the best modes of the invention. Major differences between the circuits FIG. 2 and FIG. 4 follow. Firstly, the resistor R11 is used in place of the level shift voltage source 11. Secondly, a current mirror circuit 17 including pnp transistors Q17$_1$ and Q17$_2$ is used for the current source 17. That is to say, the collectors of the transistors Q18 and Q20 are connected to the collectors of the transistors Q17$_1$ and Q17$_2$, respectively. The emitters of the transistors Q17$_1$ and Q17$_2$ are connected to the terminal 102, through resistors R17$_1$ and R17$_2$. The transistor Q17$_1$ is connected at the base to the base of the transistor Q17$_2$, through a resistor R17$_3$. The base of the transistor Q17$_2$ is connected to the collector thereof. The resistor R17$_3$ is used to reduce a variation of the currents fed from the current mirror circuit 17 to the differential circuit 16 due to a variation of the current amplification factor β of the transistors Q17$_1$ and Q17$_2$.

Thirdly, the emitters of the transistors Q14 and Q16 are connected through the resistors R14 and R16 to the terminal 102. By making the resistance of the resistor R14 equal to that of the resistor R16, the current I2 may be substantially equal to the current I3. Between the base and collector of the transistor Q14 is connected a capacitor C14 for preventing oscillation. Fourthly, the current output circuit 18 includes a circuit for changing the direction of the output current and a circuit for increasing the output current. The collector of the transistor Q18 is coupled with the bases of a pnp transistor $Q22_1$ and a pnp transistor $Q22_2$. The emitters of the transistors $Q22_1$ and $Q22_2$ are connected through resistors $R18_1$ and $R18_2$ to the terminal 102. The collector output currents of the transistors $Q22_1$ and $Q22_2$ may be changed in accordance with the resistances of the resistors $R18_1$ and $R18_2$. These resistors also restricts a variation of the collector output current. The collector current Io1 of the transistor $Q22_2$ serves as a first constant current output Io1.

The collector current Io2 of the transistor $Q22_1$ is fed to the base of a multi-emitter npn transistor $Q22_3$. The emitters of the transistor $Q22_3$ are connected through the resistor $R18_3$ to the terminal 100. The base of the transistor $Q22_3$ is connected to the collector of an npn transistor $Q22_4$. The emitter of the transistor $Q22_4$ is connected through a resistor $R18_4$ to the terminal 100. The base of the transistor $Q22_4$ is connected to the base of the transistor $Q22_3$, through a resistor $R18_5$. The resistor $R18_5$ is used for compensating for the current amplification factor of the transistor $Q22_4$. The collector current Io3 of the transistor $Q22_3$ serves as a second constant current output Io3. The reason why the multi-emitter type transistors are used for the transistors $Q22_1$ and $Q22_3$ is to increase its collector current in stable condition. In this connection, the second constant current output Io3 can stably be taken out larger than the first constant current output Io1. Further, the collector current Io2 of the transistor $Q22_1$ may be used as the constant current output Io2. Also in this case, Io2 may be selected to be larger than Io1.

Fifthly, a start circuit 30 is provided. At the initial stage of the turning-on of a power source, the transistors Q10 to Q22 are all turned off so that the first and second potential providing means 10 and 12 are not biased. Accordingly, unless the transistor Q10 or Q18 is once biased, the FIG. 2 or FIG. 4 circuit remains numatured to its stationary state. The start circuit 30 is used to once biase the transistor Q10 or Q18 at the initial stage of the power-on. To this end, the first emitter of an npn transistor $Q30_1$ of multi-emitter type is connected to the base of the transistor Q18. The second emitter of the transistor $Q30_1$ is connected to the terminal 100, through the base and collector to emitter path of an npn transistor $Q30_2$. The base and collector of the transistor $Q30_1$ are connected to the terminal 102 through a resistor R30. The terminal 100 is grounded.

When the power source is turned on, the base potential of the transistor $Q30_1$ becomes approximately 1.2 to 1.3 V. Following this, the first emitter potential of the transistor $Q30_1$ or the start potential is raised by about 0.6 to 0.7 V, so that the transistor Q18 is turned on. Upon the turning-on of the transistor Q18, the transistors Q14 and Q16 are turned on so that the transistors Q10 and Q12 are biased. In this manner, the transistors Q10 to Q22 are all biased so that the FIG. 4 circuit enters into its stationary state. In the stationary state, the first potential E1 and the second potential E2 are raised to about 0.7 to 0.8 V. As a result, the emitter to base of the transistor $Q30_1$ is not forwardly biased and the function of the start circuit 30, i.e. its starting operation, ends.

The FIG. 4 circuit is a more practical embodiment of the FIG. 2 circuit. Specifically, by employing the current mirror circuit 17, the open loop gain may be increased, and the collector potential of the transistor Q18 may be made equal to that of the transistor Q20. Further, the collector currents of the transistors Q18 and Q20 are automatically balanced. Accordingly, the FIG. 4 circuit is more stable than the FIG. 2 circuit and has a lesser variation of the output Io than that of the latter circuit. Moreover, the FIG. 4 circuit further improves the ripple reduction or the early effect due to the variation of the power source voltage. Additionally, since the constant supply direction is changed by the transistor $Q22_3$, an application range of the constant current circuit is increased. The collector current Io1 of the transistor $Q22_2$ may be used as a common emitter current of the differential circuit comprised of pnp transistors. The collector current Io3 of the transistor $Q22_3$ may be used as the common emitter current of the other differential circuit comprised of npn transistors. The collector current Io3 of the transistor $Q22_3$ may be increased to be large through the above-mentioned current increasing or current boost operation. Accordingly, the current Io3 may be used as a constant current source for various differential circuits and other circuits.

In order to keep a good current balance of the differential circuit 16, it is preferable that the sum of the base currents of the transistors Q14, Q16, $Q22_1$ and $Q22_2$ or the first current I1 is equal to the sum of the base currents of the transistors $Q17_1$ and $Q17_2$ or a fourth current I4. The adjustment of I1-I4 is performed by changing the resistor R10, for example. Increasing the resistance of the resistor R10 decreases the common emitter current $I_E$ so that the fourth current I4 also decreases. Conversely, decreasing the resistor R10 increases the current $I_E$ and the current I4. As the current $I_E$ is adjusted to have a given magnitude, I1 is equal to I4, i.e. I1=I4 so that the current balance of the differential circuit 16 is more perfected. When the current amplification factors of the transistors Q14, Q16, $Q17_1$, $Q17_2$, $Q22_1$ and $Q22_2$ are substantially equal one another, by so selecting the resistor R10 that the current sum I2+I3+Io1+Io2 is equal to the collector current sum ($\simeq I_E$) of the transistors $Q17_1$ and $Q17_2$, the condition of I1=I4 is substantially satisfied.

Figure 5:
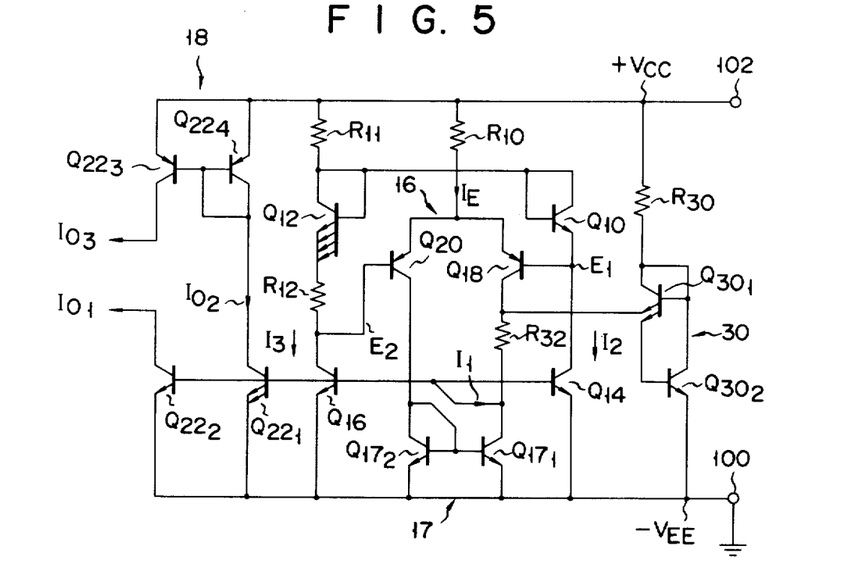
FIG. 5 shows a circuit diagram of a modification of the circuit in FIG. 2 or 4.

Turning now to FIG. 5, there is shown a modification of the FIG. 4 circuit. Major difference of the FIG. 5 circuit from the FIG. 4 circuit resides in the conductivity type of the transistors used and the start circuit 30.

The transistors Q14, Q16, $Q17_1$, and $Q17_2$ are all of the npn type and the transistors Q18 and Q20 are of the pnp type. The transistors Q10 and Q12 may be either of the pnp type or the npn type. In this embodiment, in order to reduce the number of the pnp transistors of the lateral type structure requiring a large chip area, the npn transistors are used for the transistors Q10 and Q12. The biasing by the start circuit 30 at the time of power-on is performed for the transistors Q14 and Q16. To this end, the first emitter of the transistor $Q30_1$, together with the collector of the transistor Q18, is connected through a resistor R32 to the bases of the transistors Q14 and Q16.

Immediately after the power source is turned on, the transistors Q10 to Q22 are all cut off. At this time, about 1.2 V appears at the base of the transistor $Q30_1$ and about 0.6 V at the first emitter thereof. When the transistors Q14 and Q16 are biased by the start potential 0.6 V, the transistors Q18 and Q20 are turned on to allow the FIG. 5 circuit to be in the stationary state. Assume now that the collector current resulting from the turning on of the transistor Q18 causes 0.2 V voltage drop, for example, to appear across the resistor R32. As a result, the collector potential of the transistor Q18 or the first emitter potential of the transistor Q30₁ increases to approximately 0.8 V. Upon this, the first emitter to base of the transistor Q30₁ is not forwardly biased so that the operation of the start circuit 30 stops. The collector of the transistor Q30₂ is connected to the base and the collector of the transistor q30₁, but the collector of the transistor Q30₂ may be connected to the base thereof.

In FIG. 5 circuit, the number of the lateral structure pnp transistor is smaller than that of the FIG. 4 circuit so that, when it is integrated, the chip area may be made small.

Figure 6:
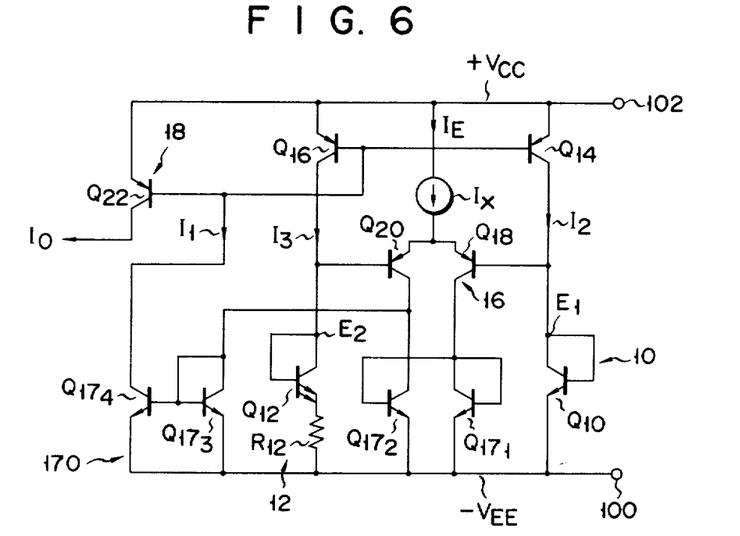
FIG. 6 shows a circuit diagram of a modification of the circuit in FIGS. 2, 4 or 5.

FIG. 6 shows a modification of the FIg. 2, FIG. 4 or FIG. 5 circuit. In this figure, the start circuit 30 is omitted for simplicity. Actually, to the base of the transistor Q18 is connected the first emitter of the transistor Q30₁ in FIG. 4, for example. Briefly, in the circuit in FIG. 6, the pnp type transistors are used for the transistors Q18 and Q20 in FIG. 2. The level shift voltage source 11 in FIG. 2 is omitted, and the resistor R10 is replaced by a constant current source Ix connected between the emitters of the transistors Q18, Q20 and the second power source circuit +Vcc. The current source 17 is substituted by a current mirror circuit 170 connecting to a first power source circuit $-V_{EE}$.

The circuit 170 is comprised of two sets of current mirror. The bases of npn transistors Q17₁ and Q17₂, which form a first current mirror, are connected to the collector of Q17₁. The collectors of the transistors Q17₁ and Q17₂ are connected to the collectors of the transistors Q18 and Q20, respectively. The bases of npn transistors Q17₃ and Q17₄, which form a second current mirror, are connected to the collector of Q17₃. The collectors of the transistors Q17₃ and Q17₄ are connected respectively to the collector of the transistor Q20 and the bases of pnp transistors Q14, Q16 and Q22. The second current mirror are provided to make uniform the collector voltages of the transistors Q18 and Q20 in order to avoid the Early effect.

The basic circuit operation is substantially common in the circuits in FIGS. 2, 4 and 5. The first current I1 is, however, obtained from the collector of the transistor Q20, through the second current mirror (Q17₃+Q17₄), because the second current mirror inverts current direction, or the second current mirror operates as a phase inverter.

Although specific circuit constructions have been illustrated and described herein, it is not intended that the invention be limited to the elements, devices and/or circuit constructions disclosed. One skilled in the art will recognize that the particular elements, devices or sub-circuits may be used without departing from the scope and spirit of the invention.

For example, the emitter area ratio of the transistors Q10 and Q12 may be 1:1 and that of the transistors Q16 and Q14 may be 1:N. The essential thing is that the emitter current density ratio of the transistors Q10 and Q12 is 1/N (N>1).

What is claimed is:

1. A constant current source circuit comprising:
   first potential providing means, including a first transistor connected in diode fashion, for providing at one end thereof a first potential;
   second potential providing means, including a second transistor which is connected in diode fashion and has a lower emitter current density than that of said first transistor and a first resistor connected in series to said second transistor, for providing at one end a second potential;
   comparing means for comparing the first and second potentials and providing a first current corresponding to a potential difference between these potentials;
   a third transistor for providing at the collector circuit thereof a second current, corresponding to the first current, said second current being provided to said first potential providing means;
   a fourth transistor for providing at the collector circuit thereof a third current corresponding to the first current said third current being provided to said second potential providing means; and
   current supply means for supplying a constant current output corresponding to the first current.

2. A constant current cource circuit comprising:
   first potential providing means, including a first transistor connected in diode fashion, for providing at one end thereof a first potential;
   second potential providing means, including a second transistor which is connected in diode fashion and has a lower emitter current density than that of said first transistor and a first resistor connected in series with said second transistor, for providing at one end thereof a second potential;
   comparing means for comparing the first and second potentials and providing a first current corresponding to a potential difference therebetween;
   a third transistor for providing a second current, corresponding to the first current, said second current being supplied to said first potential providing means;
   a fourth transistor for providing at the collector circuit thereof, a third current corresponding to the first current said third current being supplied to said second potential providing means; and
   current supply means for supplying a constant current output corresponding to the first current;
   said comparator means comprising:
      a fifth transistor having a collector circuit connected to the bases of said third and fourth transistors the collector circuit receiving the first current, and having a base coupled to the first potential;
      a sixth transistor which is of the same conductivity type as that of said fifth transistor and, which, together with said fifth transistor forms a differential amplifier circuit, the sixth transistor having its base coupled to the second potential.

3. A constant current source circuit according to claim 2, wherein said current supply means comprises a seventh transistor for providing at the collector circuit thereof the constant current output.

4. A constant current source according to claim 3, wherein said seventh transistor is of the same conductivity type as that of said third and fourth transistors and the emitter current density of said seventh transistor is lower than that of said third and fourth transistors for increasing the amount of said constant current output.

5. A constant current source circuit according to claim 2, wherein said comparing means further comprises;
   an eighth transistor, connected in diode fashion to form a diode circuit, connected in series with the collector circuit of said sixth transistor; and a ninth transistor of opposite conductivity type to that of said fifth transistor, the emitter-base circuit of which is coupled in parallel with the diode circuit of said eigth transistor, and the collector of which is connected to the collector of said fifth transistor so as to form a current mirror circuit in cooperation with said eighth transistor.

6. A constant current source circuit according to claim 5, wherein the current amplification factors of said eighth and ninth transistors are substantially equal to each other; and the common emitter currents of said fifth and sixth transistors are set to predetermined magnitudes in order that a fourth current flowing from the bases of said eighth and ninth transistors into the collector circuit of said sixth transistor, is made substantially equal to the first current which flows from the bases of said third and fourth transistors and the base of the seventh transistor in the current output circuit and into the collector circuit of said fifth transistor.

7. A constant current source circuit according to claim 3 or 4, wherein said current supply means further comprises a tenth transistor the base-emitter circuit of which is connected in series to the collector circuit of said seventh transistor in order to invert the flow direction of the constant current output, said tenth transistor being of opposite conductivity type to that of said seventh transistor and providing at its collector circuit a second constant current output.

8. A constant current source circuit according to claim 7, further comprising a second resistor connected between the other ends of said first and second potential providing means and a first power source circuit, and wherein, in order to make the temperature coefficient of the first potential substantially zero, the ratio of said first resistive element to said second resistive element satisfies the following relation $$2(R11/R12)(k/q)\ln N + \partial V_{BE}/\partial T = 0$$

where R12 and R11 are resistances of said first and second resistors, k Boltzmans's constant, q the electric charge of an electron, N a real number and indicating the ratio of the emitter current densities of said first and second transistors, $V_{BE}$ a threshold voltage across the base to emitter circuit of said first transistor, and T an absolute temperature.

9. A constant current source circuit according to claim 7, further comprising a second resistive element connected between the other ends of said first and second potential providing means and a first power source circuit, and wherein, in order to make the temperature coefficient of the first potential substantially zero, the emitter current ratio of said first transistor to said second transistor satisfies the following relation $$2(R11/R12)(k/q)\ln N + \partial V_{BE}/\partial T = 0$$

where R12 and R11 are resistances of said first and second resistive elements, k Boltzmans's constant, q the electric charge of an electron, N a real number and indicating the ratio of the emitter current densities of said first and second transistors, $V_{BE}$ a threshold voltage across the base to emitter circuit of said first transistor, and T an absolute temperature.

10. A constant current source circuit according to claim 3, wherein said comparing means further comprises; an eighth transistor which is connected in diode fashion and is connected in series with the collector circuit of said fifth transistor; a ninth transistor which is of opposite conductivity type to that of said sixth transistor, of which the base and emitter circuit is coupled in parallel with a diode circuit of said eighth transistor, and of which the collector is connected to the collector of said sixth transistor; a tenth transistor which is connected in diode fashion and is connected in parallel with the collector and emitter of said ninth transistor; and eleventh transistor which is of opposite conductivity type to that of said seventh transistor, of which the base and emitter circuit is coupled in parallel with a diode circuit of said tenth transistor, and of which the collector is connected to the bases of said third, fourth and seventh transistors.

11. A constant current source circuit comprising:
first potential providing means, including a first transistor connected in diode fashion, for providing at one end thereof a first potential;
second potential providing means, including a second transistor which is connected in diode fashion and has a lower emitter current density than that of said first transistor, and a first resistor connected in series to said second transistor, for providing at one end thereof a second potential;
a fifth transistor having a base coupled to the first potential, and having an emitter coupled to a first power source via an emitter resistor, for providing, at the collector thereof, a first current;
a sixth transistor having a base coupled to the second potential, and an emitter coupled to the emitter of said fifth transistor, and being of the same conductivity type as that of said fifth transistor;
a third transistor, of the opposite conductivity type to that of said fifth transistor, having a base coupled to the collector of said fifth transistor and having an emitter coupled to a second power source circuit, for supplying from the collector circuit thereof to the first potential providing means a second current corresponding to the first current;
a fourth transistor, of the same conductivity type as that of said third transistor, having a base connected to the collector of said fifth transistor and having an emitter connected to the second power source circuit, for supplying from the collector circuit thereof to the second potential providing means a third current corresponding to the first current; and
a seventh transistor, of the same conductivity type as that of said fourth transistor, having a base connected to the collector said fifth transistor and having an emitter connected to the second power circuit, for providing at the collector circuit thereof a constant current output corresponding to the first current.

12. A constant current source circuit according to any one of the claims of the group including 2, 3, 5, 6, 4 and 8, further comprising a second resistor connected between the other ends of said first and second potential providing means and a first power source circuit, and wherein, in order to make the temperature coefficient of the first potential substantially equal to zero, the ratio of said first resistive element to said second resistive element satisfies the following relation $$2(R11/R12)(k/q)\ln N + \partial V_{BE}/\partial T = 0$$

where R12 and R11 are resistances of said first and second resistors, k Boltzmans's constant, q the electric charge of an electron, N a real number indicating the ratio of the emitter current densities of said first and second transistors, $V_{BE}$ a threshold voltage across the base to emitter circuit of said first transistor, and T an absolute temperature.

13. A constant current source circuit according to any one of the group including 2, 3, 5, 6, 4 and 11, further comprising a second resistor connected between the other ends of said first and second potential providing means and a first power source circuit, and wherein, in order to make the temperature coefficient of the first potential substantially zero, the emitter current ratio of said first transistor to said second transistor satisfies the following relation $$2(R11/R12)(k/q)\ln N + \partial V_{BE}/\partial T = 0$$

where R12 and R11 are resistances of said first and second resistors, k Boltzmans's constant, q the electric charge of an electron, N a real number indicating the ratio of the emitter current densities of said first and second transistors, $V_{BE}$ a threshold voltage across the base to emitter circuit of said first transistor, and T an absolute temperature.

14. A constant current source circuit comprising:
first potential providing means, including a first transistor connected in diode fashion, for providing at one end thereof a first potential;
second potential providing means, including a second transistor which is connected in diode fashion and has a lower emitter current density than said first transistor and a first resistor connected in series with said second transistor, for providing at one end a second potential;
comparing means for comparing the first and second potentials and providing a first current corresponding to a potential difference between these potentials said comparing means including a differential circuit having a symmetrical circuit configuration;
a third transistor for providing a second current, corresponding to the first current, the second current being coupled to said first potential providing means;
a fourth transistor for providing at the collector circuit thereof a third current corresponding to the first current the third current being coupled to the second potential providing means; and
current supply means for supplying a constant current output corresponding to the first current.

15. A constant current source circuit comprising:
first potential providing means, including a first transistor connected in diode fashion, for providing at one end thereof a first potential;
second potential providing means, including a second transistor which is connected in diode fashion and has a lower emitter current density than said first transistor and a first resistor connected in series with said second transistor, for providing at one end a second potential;
comparing means for comparing the first and second potentials and providing a first current corresponding to a potential difference between these potentials;
a third transistor for providing a second current, corresponding to the first current, the second current being coupled to said first potential providing means;
a fourth transistor for providing at the collector circuit thereof a third current corresponding to the first current, the third current being coupled to the second potential providing means, and the third and fourth transistors forming a circuit configuration symmetrical with respect to their base circuit; and
current supply means for supplying a constant current output corresponding to the first current.

16. A constant current source sircuit comprising:
first potential providing means, including a first transistor connected in diode fashion, for providing at one end thereof a first potential;
second potential providing means, including a second transistor which is connected in diode fashion and has a lower emitter current density than said first transistor and a first resistor connected in series with said second transistor, for providing at one end a second potential;
comparing means for comparing the first and second potentials and providing a first current corresponding to a potential difference between these potentials the comparing means including a differential circuit having a symmetrical circuit configuration;
a third transistor for providing a second current, corresponding to the first current, the second current being coupled to said first potential providing means;
a fourth transistor for providing at the collector circuit thereof a third current the third current being coupled to the second potential providing means the third and fourth transistors forming a circuit configuration that is symmetrical with respect to their base circuit which is connected to the output of the differential circuit; and
current supply means for supplying a constant current output corresponding to the first current.

* * * * *